(12) United States Patent
Ren et al.

(10) Patent No.: US 11,251,807 B1
(45) Date of Patent: Feb. 15, 2022

(54) WIDE BANDWIDTH ADC WITH INHERENT ANTI-ALIASING AND HIGH DC PRECISION

(71) Applicant: Analog Devices International Unlimited Company, Limerick (IE)

(72) Inventors: Naiqian Ren, Limerick (IE); Roberto Sergio Matteo Maurino, Turin (IT)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/093,948

(22) Filed: Nov. 10, 2020

(51) Int. Cl.
   *H03M 3/00* (2006.01)
(52) U.S. Cl.
   CPC .......... *H03M 3/458* (2013.01); *H03M 3/344* (2013.01)
(58) Field of Classification Search
   CPC .... H03M 3/458; H03M 3/344; H03M 7/3004; H03M 3/50; H03M 1/12
   USPC .......................................................... 341/143
   See application file for complete search history.

(56) References Cited

U.S. PATENT DOCUMENTS

| | | | |
|---|---|---|---|
| 5,079,550 A | 1/1992 | Sooch et al. | |
| 5,461,381 A * | 10/1995 | Seaberg | H03M 3/37 |
| | | | 341/143 |
| 6,121,909 A | 9/2000 | Lee et al. | |
| 6,373,418 B1 * | 4/2002 | Abbey | H03M 7/3022 |
| | | | 341/143 |
| 6,701,297 B2 | 3/2004 | Main | |
| 6,924,757 B2 | 8/2005 | Adams et al. | |
| 8,299,850 B1 | 10/2012 | Kutz et al. | |
| 8,451,051 B2 * | 5/2013 | Chen | H03M 3/396 |
| | | | 327/554 |
| 8,559,891 B2 | 10/2013 | Rumley et al. | |
| 8,779,958 B1 | 7/2014 | Maurino et al. | |
| 9,083,369 B2 | 7/2015 | Coln et al. | |
| 9,564,916 B2 | 2/2017 | Bandyopadhyay | |
| 9,729,165 B2 | 8/2017 | Gupta et al. | |
| 9,735,797 B2 | 8/2017 | Zhao et al. | |
| 9,793,908 B2 * | 10/2017 | Shibata | H03K 17/0822 |
| 9,843,337 B1 | 12/2017 | Li et al. | |
| 10,073,812 B2 | 9/2018 | Weldon | |
| 10,187,075 B1 | 1/2019 | Patil et al. | |
| 10,541,706 B2 * | 1/2020 | Erol | H03M 3/458 |
| 10,680,633 B1 | 6/2020 | Healy et al. | |
| 2012/0139764 A1 * | 6/2012 | Sosio | H03M 3/368 |
| | | | 341/110 |

FOREIGN PATENT DOCUMENTS

JP          4777455 B2          7/2011

OTHER PUBLICATIONS

Balagopal, Sakkarapani, et al., "A Low-Power Single-Bit Continuous-Time Delta-Sigma Converter with 92.5 dB Dynamic Range for Biomedical Applications", J. Low Power Electron. Appl., 2(3), (2012), 197-209.

(Continued)

*Primary Examiner* — Jean B Jeanglaude
(74) *Attorney, Agent, or Firm* — Schwegman Lundberg & Woessner, P.A.

(57) ABSTRACT

A wide bandwidth ADC circuit that combines a resistive-input continuous-time sigma-delta ADC circuit with a second ADC circuit having a switched capacitor input. The combination of these two ADC circuits can achieve an easy-to-drive, alias free, wide bandwidth ADC that has excellent DC precision.

20 Claims, 3 Drawing Sheets

(56) References Cited

OTHER PUBLICATIONS

Barangi, Mahmood, et al., "A Continuous-Time Sigma-Delta ADC with Tunable Pass-Band for Multi-Standard Applications", IEEE 56th International Midwest Symposium on Circuits and Systems (MWSCAS), (2013), 633-636.

Padyana, Aravind Kumar, "Design Considerations for Wide Bandwidth Continuous-Time Low-Pass Delta-Sigma Analog-to-Digital Converters", MS Thesis, Texas A&M University, (Dec. 2010), 104 pgs.

Ranjbar, Mohammad, "Power Efficient Continuous-Time Delta-Sigma Modulator Architectures for Wideband Analog to Digital Converters", PhD Dissertation, U. of Massachusetts Amherst, (May 2012), 226 pgs.

Shoaei, Omid, "Continuous-Time Delta-Sigma A/D Converters for High Speed Applications", PhD Thesis, Carleton University, (Nov. 29, 1995), 230 pgs.

Yan, Liu, et al., "A continuous-time/discrete-time mixed audio-band sigma delta ADC", Journal of Semiconductors, 32(1), pp. 015004-1-015004-6, (Jan. 2011), 7 pgs.

\* cited by examiner

WIDE BANDWIDTH ADC WITH INHERENT ANTI-ALIASING AND HIGH DC PRECISION

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in precision measurement systems, electronics can be provided with one or more sensors to make measurements, and these sensors can generate an analog signal. The analog signal can then be provided to an analog-to-digital converter (ADC) as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

A difference between the input voltage and the output voltage of the ADC can correspond to the quantization error of the ADC. In some ADCs, the quantization error can be further processed by ADC circuitry to "shape" the quantization error, which appears as quantization noise in the frequency domain. Noise shaping techniques can push the quantization noise away from the signal band of interest and into higher frequencies, for example.

A sigma-delta modulator is a feedback system that can achieve high-resolution digital signals. Sigma-delta modulators have been implemented in a wide variety of electronic circuits, including but not limited to, analog-to-digital converters (ADCs), digital-to-analog converters (DACs), frequency synthesizers, and other electronic circuits.

ADCs based on sigma-delta modulation have been widely used in digital audio and high precision instrumentation systems. Typically, a sigma-delta ADC encodes an analog signal using a sigma-delta modulator (e.g., using a low resolution ADC such as a 1-bit ADC, Flash ADC, Flash quantizer, etc.) and then, if applicable, applies a digital filter to the output of the sigma-delta modulator to form a higher-resolution digital output. A loop filter can be provided to provide error feedback to the sigma-delta modulator. One characteristic of a sigma-delta modulator is its noise shaping capability. As a result, sigma-delta ADCs are generally able to achieve high resolution analog-to-digital conversion.

SUMMARY OF THE DISCLOSURE

This disclosure describes a wide bandwidth ADC circuit that combines a resistive-input continuous-time sigma-delta ADC circuit with a second ADC circuit having a switched capacitor input. The combination of these two ADC circuits can achieve an easy-to-drive, alias free, wide bandwidth ADC that has excellent DC precision.

In some aspects, this disclosure is directed to a wide bandwidth analog-to-digital converter (ADC) circuit comprising: a continuous-time sigma-delta ADC circuit having a first input coupled to a resistive element to receive a first analog input signal and generate a first digital output signal; a second ADC circuit, independent of the continuous-time sigma-delta ADC circuit, having a second input coupled to a switched capacitor circuit to receive a second analog input signal and an output to generate a second digital output signal that is independent of the first digital output signal; and a digital signal processor coupled to receive the first digital output signal and the second digital output signal and an output to generate at least one processed digital output signal.

In some aspects, this disclosure is directed to a method of operating a wide bandwidth ADC circuit, the method comprising: receiving, using a continuous-time sigma-delta ADC circuit, a first analog input signal and generating a first digital output signal; receiving, using a second ADC circuit that is independent of the continuous-time sigma-delta ADC circuit, a second analog input signal and generating a second digital output signal that is independent of the first digital output signal; and processing the first digital output signal and the second digital output signal and generating at least one processed digital output signal.

In some aspects, this disclosure is directed to a wide bandwidth analog-to-digital converter (ADC) circuit comprising: a first continuous-time sigma-delta ADC circuit having a first input coupled to a resistive element to receive a first analog input signal and generate a first digital output signal; a second continuous-time sigma-delta ADC circuit, independent of the first continuous-time sigma-delta ADC circuit, having a second input coupled to a switched capacitor circuit to receive a second analog input signal and an output to generate a second digital output signal that is independent of the first digital output signal; and a digital signal processor coupled to receive the first digital output signal and the second digital output signal and an output to generate at least one processed digital output signal.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Many applications benefit from, or sometimes require, a wide bandwidth analog-to-digital converter (ADC) solution with a good AC response together with high DC precision. The bandwidth of an ADC refers to the range of frequencies of analog signals it can properly convert to a digital signal. High DC precision refers to an ADC having low gain error, low offset error, low gain and offset error drift, low integral non-linearity, and low 1/f noise.

The present inventors have recognized that existing ADC architectures have limitations in combining DC performance with high bandwidth and good AC performance. Some ADC architectures are good for narrowband measurements, e.g., DC measurements. For example, ADCs can include inputs coupled to capacitive circuits and can have very good DC performance. However, such ADCs can present system level challenges when used for AC measurement.

ADCs having inputs coupled to capacitive circuits can be difficult to drive, especially when both high bandwidth and high precision are required. As such, ADCs having inputs coupled to capacitive circuits can require a dedicated high bandwidth ADC driver amplifier. The driver amplifier can increase power consumption, DC error, and noise and signal distortion.

In addition, ADCs having inputs coupled to capacitive circuits can be prone to aliasing. That is, even with oversampling and digital filtering, there may be no rejection at the sampling rate fs. Thus, such ADCs can require an analog anti-aliasing filter to help protect against signal aliasing. However, active anti-aliasing filters can increase power consumption, DC error, noise and signal distortion, and channel-to-channel phase matching error.

Some ADC architectures are better for AC measurements, such as high-speed measurements. For example, some continuous-time ADC circuits can include inputs coupled to resistive elements (also referred to as "resistive input ADCs"), which can make them easy to drive and can provide inherent anti-aliasing properties. However, these resistive input ADCs can also present challenges to a designer.

For example, it can be difficult to achieve good DC performance with resistive input ADCs as compared with ADCs having inputs coupled to capacitive circuits. Resistors used by resistive input ADCs, especially polysilicon resistors, can have higher voltage coefficients than capacitors, which can lead to worse integral nonlinearity (INL). In addition, resistors, especially polysilicon resistors, can have flicker noise, unlike capacitors. Further, resistors can be less stable versus temperature and aging, in comparison to capacitors, which can lead to worse gain error drift and offset error drift over both temperature and time.

With resistive input ADCs, it can be difficult to achieve a flexible input common mode range. A common mode shift can cause current to flow in the resistors, which can increase noise. Further, a common mode shift plus a mismatched resistor network can cause offset error.

This disclosure describes a wide bandwidth ADC circuit that combines a resistive-input continuous-time sigma-delta ADC circuit with a second ADC circuit having a switched capacitor input. The combination of these two ADC circuits can achieve an easy-to-drive, alias free, wide bandwidth ADC that has excellent DC precision.

Figure 1:
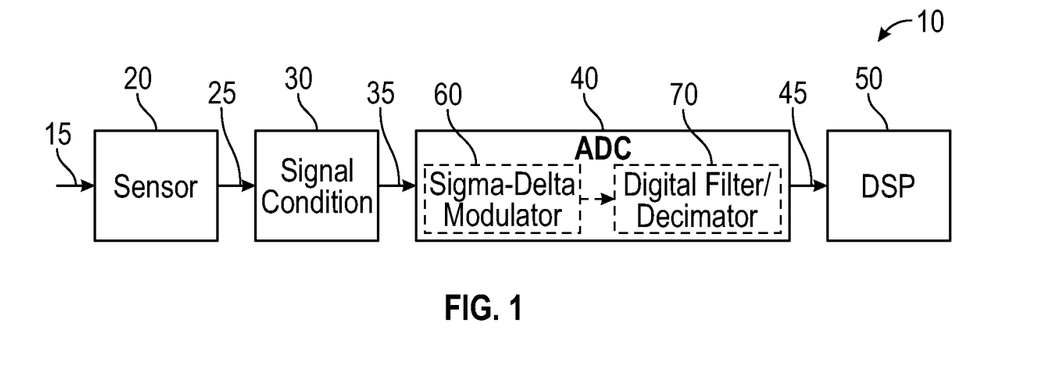
FIG. 1 is a schematic block diagram of an example of a data acquisition system, which can implement a sigma-delta modulator.

FIG. 1 is a schematic block diagram of an example of a data acquisition system 10, which can implement a sigma-delta modulator. The data acquisition system 10 can be an electronic device (including an electronic circuit and/or one or more components) configured to convert signals (such as analog signals) into a usable form. In various implementations, the data acquisition system 10 can convert physical conditions into digital form, which can be stored and/or analyzed. FIG. 1 has been simplified for the sake of clarity. Additional features can be added in the data acquisition system 10, and some of the features described can be replaced or eliminated in other embodiments of the data acquisition system 10.

In FIG. 1, the data acquisition system 10 can include an input signal 15 that represents a physical condition, such as temperature, pressure, velocity, flow rate, position, other physical condition, or combination thereof. A sensor circuit block 20 can receive an input signal 15 and convert the physical condition (represented by input signal 15) into an electrical signal, such as an analog signal 25. The analog signal 25 can be a voltage or current that represents the physical condition (represented by the input signal 15).

A signal conditioning circuit block 30 can receive and adjust the analog signal 25 within an acceptable range of an analog-to-digital converter (ADC), providing a conditioned analog signal 35. The conditioned analog signal 35 can be provided at ADC circuit block 40, such that the signal conditioning circuit block 30 can act as an interface between the sensor circuit block 20 and the ADC circuit block 40, the conditioning analog signal 25 (and thus providing the conditioned analog signal 35) before the ADC circuit block 40 digitizes the analog signal. The signal conditioning circuit block 30 can amplify, attenuate, filter, and/or perform other conditioning functions to the analog signal 25. The ADC circuit block 40 can receive and convert the conditioned analog signal 35 into digital form, providing a digital signal 45. The digital signal 45 can represent the physical quantity received by the sensor via the input signal 15. A digital signal processor (DSP) circuit block 50 can receive and process digital signal 45.

The ADC circuit block 40 can include a sigma-delta ADC that generates a digital signal using a feedback technique, where the sigma-delta ADC can oversample its input signal (here, the conditioned analog signal 35) and perform noise-shaping to achieve a high-resolution digital signal (here, the digital signal 45). The sigma-delta ADC can include a sigma-delta modulator 60 and a digital filter/decimator 70. The sigma-delta modulator 60 can use oversampling (for example, a sampling rate above Nyquist rate) and filtering to generate a digital signal that represents the input signal received by the sigma-delta ADC (such as the conditioned analog signal 35).

In various implementations, the sigma-delta ADC feedback loop forces the output of the modulator to be a good representation of the input signal in the bandwidth of interest. The digital filter/decimator 70 can attenuate noise and/or slow a data rate (for example, to a Nyquist sampling rate) of the digital signal, providing the digital signal 45. The digital filter/decimator 70 can include a digital filter, a decimator, or both. The digital filter can attenuate the digital signal received from the sigma-delta modulator 60, and the decimator can reduce a sampling rate of the digital signal received from the sigma-delta modulator 60.

Figure 2:
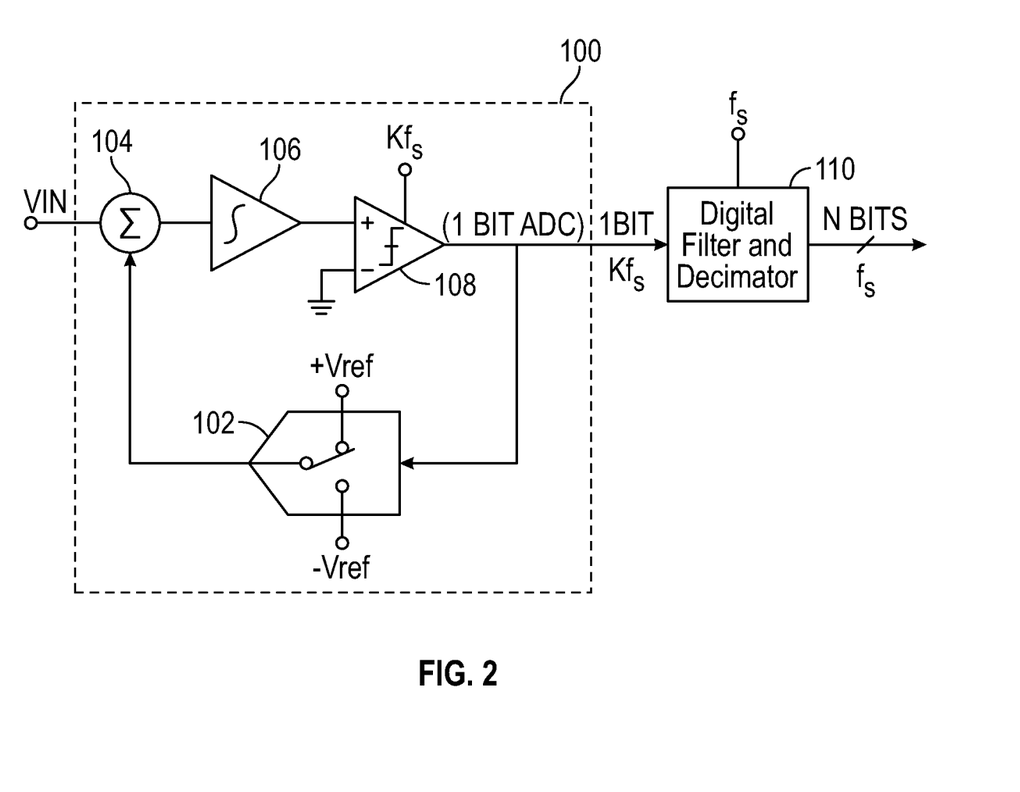
FIG. 2 is a block diagram of an example of a first-order single-bit sigma-delta ADC.

FIG. 2 is a block diagram of an example of a first-order single-bit sigma-delta ADC. The sigma-delta modulator 100 can be an example of the sigma-delta modulator 60 of FIG. 1. The sigma-delta modulator 100 can convert an input signal (Vin) into a continuous serial stream of ones and zeros at a rate determined by a sampling clock frequency Kfs. A one-bit digital-to-analog converter (DAC) 102 can be driven by the serial output data stream to generate a feedback signal. The output of the digital-to-analog converter (DAC) 102 can be subtracted from the input signal using a summing element 104. The summing element 104 can be implemented as the summing node of an operational amplifier (op amp), such as the op amp of an integrator 106.

The integrator 106 can integrate the output of summing element 104, and the output of the integrator 106 can be applied to a clocked latched comparator 108. For an input signal of zero, the comparator output can include an approximately equal number of ones and zeros. For a positive input voltage, the comparator output contains more ones than zeros. For a negative input voltage, the comparator output contains more zeros than ones. The average value of the comparator output over a number of cycles represents the input voltage. The comparator output can be applied to a digital filter and decimator 110 that averages every M cycles, where M is a positive integer greater than 1. The digital filter and decimator 110 can be an example of the digital filter/decimator 70 of FIG. 1. The decimator reduces the effective sampling rate at the output to the sampling rate fs.

Figure 3:
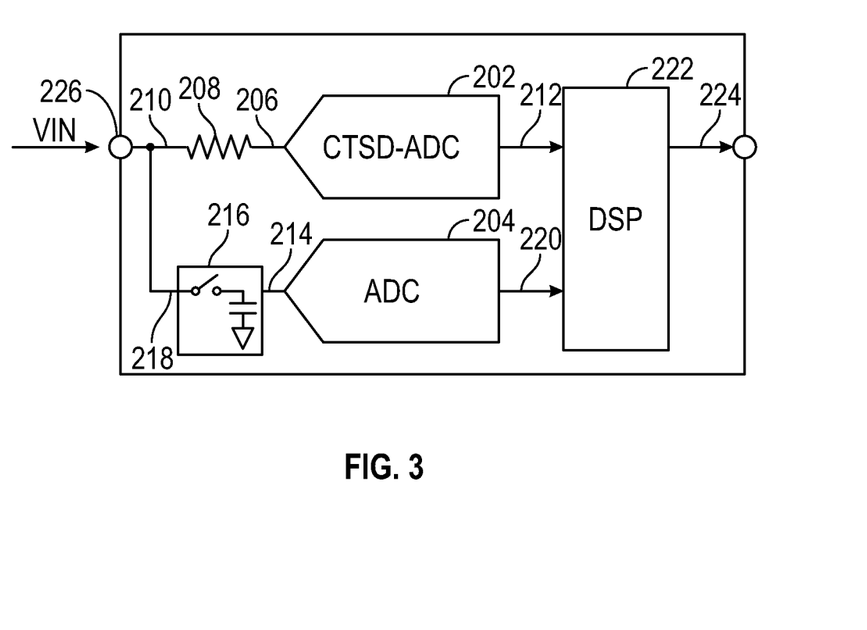
FIG. 3 is a block diagram of an example of a wide bandwidth ADC circuit, in accordance with this disclosure.

FIG. 3 is a block diagram of an example of a wide bandwidth ADC circuit 200, in accordance with this disclosure. The ADC circuit 200 in FIG. 3 can include two ADC circuits 202, 204 operating simultaneously with combined input and output. The first ADC circuit 202 can be a continuous-time sigma-delta ADC circuit having a first input 206 coupled to a resistive element 208 and configured to receive a first analog input signal 210 and generate a corresponding first digital output signal 212. Although shown separately, in some examples, the resistive element 208 can be a part of first ADC circuit 202. The first ADC circuit 202 can be used for wide bandwidth AC performance.

The second ADC circuit 204, which is independent of the continuous-time sigma-delta ADC circuit 202 (the two ADC circuits 202, 204 can operate without dependency on each other), has a second input 214 coupled to a capacitive input, such as a switched capacitor circuit 216, and is configured to receive a second analog input signal 218 and generate a corresponding second digital output signal 220 that is independent of the first digital output signal 212. Although shown separately, in some examples, the switched capacitor circuit 216 can be a part of the second ADC circuit 204. The second ADC circuit 204 can focus on narrow bandwidth DC performance and can provide a strong DC common mode rejection ratio (CMRR). In some examples, both ADC circuits 202, 204 can be running with the second ADC circuit 204 running at slower sampling rate.

In some examples, the second ADC circuit 204 can include a continuous-time sigma-delta ADC circuit with a switched capacitive input. In other examples, the second ADC circuit 204 can include a discrete-time ADC circuit. For example, the second ADC circuit 204 can include a successive approximation register (SAR) ADC circuit, a flash ADC circuit, a sigma-delta ADC circuit, or a pipeline ADC circuit.

In addition, the ADC circuit 200 can include a digital signal processor 222 configured to receive the first digital output signal 212 and the second digital output signal 220 and generate at least one processed digital output signal 224. For example, in FIG. 3, the digital signal processor 222 can be configured to combine the first digital output signal 212 and the second digital output signal 220, such that the at least one processed digital output signal 224 is a single, combined digital output signal. That is, the first digital output signal 212 and the second digital output signal 220 can be recombined digitally into a single bit stream. An example of a recombination technique is described in commonly assigned U.S. Pat. No. 9,083,369 to Coln et al. and titled "Split-path data acquisition signal chain," the entire contents of which being incorporated herein by reference.

In some examples, the ADC circuit 200 can include a single channel. For example, the ADC circuit 200 in FIG. 3 can include a first channel 226 configured to receive the first analog input signal 210. In such a configuration, the first analog input signal 210 and the second analog input signal 218 can be the same analog input signal, namely analog signal VIN in FIG. 3. In the example shown in FIG. 3, the continuous-time sigma-delta ADC circuit 202 includes a first input 206, the second ADC circuit 204 includes a second input 214, and the first input and the second input are coupled to the first channel 226.

Figure 4:
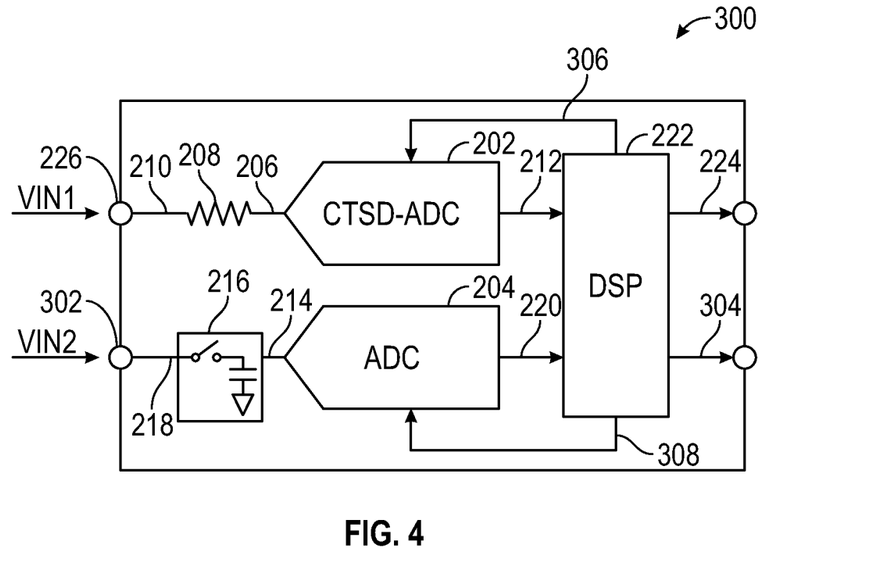
FIG. 4 is a block diagram of another example of a wide bandwidth ADC circuit, in accordance with this disclosure.

FIG. 4 is a block diagram of another example of a wide bandwidth ADC circuit, in accordance with this disclosure. The ADC circuit 300 in FIG. 4 can include two ADC circuits 202, 204 operating in parallel with separate inputs 226, 302 and separate corresponding outputs 224, 304. As an example, the ADC circuit 300 of FIG. 4 can support sensor cluster operation, such as by monitoring both vibration and temperature with separate channels.

As seen in FIG. 4, the ADC circuit 300 can include multiple input channels. For example, the ADC circuit 300 in FIG. 4 can include a first channel 226 configured to receive the first analog input signal 210 and a second channel 302 configured to receive the second analog input signal 218. The first analog input signal 210 can be the analog signal VIN1 and the second analog input signal 218 can be the analog signal VIN2. In the example shown in FIG. 4, the continuous-time sigma-delta ADC circuit 202 includes a first input 206 coupled to the first channel 226, and the second ADC circuit 204 includes a second input 214 coupled to the second channel 302.

Figure 5:
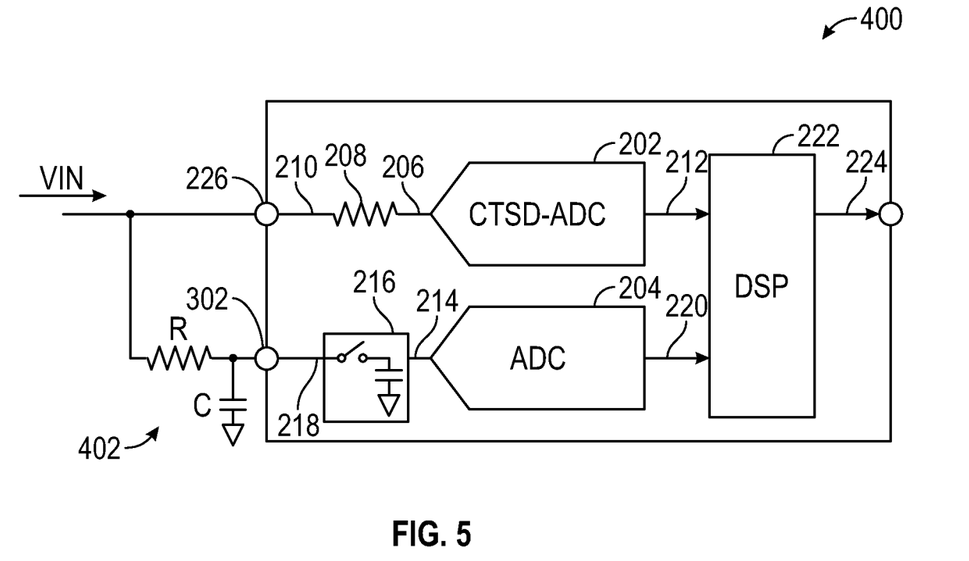
FIG. 5 is a block diagram of an example of a wide bandwidth ADC circuit including an RC filter circuit, in accordance with this disclosure.

The digital signal processor 222 can be configured to receive the first digital output signal 212 and the second digital output signal 220, process the two corresponding output signals 212, 220, and then output a first processed digital output signal 224 and a separate, second processed digital output signal 304. In some examples and as described in more detail below, the digital signal processor 222 can generate and apply a first wake-up signal 306 or a second wake-up signal 308 to either the continuous-time sigma-delta ADC circuit (wake-up signal 306) or the second ADC circuit (wake-up signal 308) in response to an amplitude exceeding a threshold, for example. FIG. 5 is a block diagram of another example of a wide bandwidth ADC circuit 400, in accordance with this disclosure. The ADC circuit 400 in FIG. 5 can include two ADC circuits 202, 204 operating simultaneously with combined input and output. In addition, the ADC circuit 400 can include an RC filter circuit 402 having a resistor R and a capacitor C.

The RC filter circuit 402 can be coupled to and can protect the switched capacitor second ADC circuit 204 from aliasing, such as sample and chop aliasing. The RC filter circuit 402 can also suppress any kickback from interfering with the input of the continuous-time sigma-delta ADC circuit 202, e.g., the channel with wide bandwidth AC performance. Both the continuous-time sigma-delta ADC circuit 202 and the second ADC circuit 204 can measure the same analog signal VIN, but the RC filter circuit 402 can remove the AC component in the second channel 302 so that there is no aliasing in the second ADC circuit 204. Then, the two digital output signals 212, 220 can be recombined by the digital signal processor 222.

Like the ADC circuit 200 of FIG. 3, in some examples, the digital signal processor 222 of FIG. 5 can be configured to combine the first digital output signal 212 and the second digital output signal 220, and the at least one processed digital output signal 224 is a single combined processed digital output signal. In other examples, however, the digital signal processor 222 of FIG. 5 can be configured to provide parallel processed digital output signals, like in FIG. 4.

Figure 6:
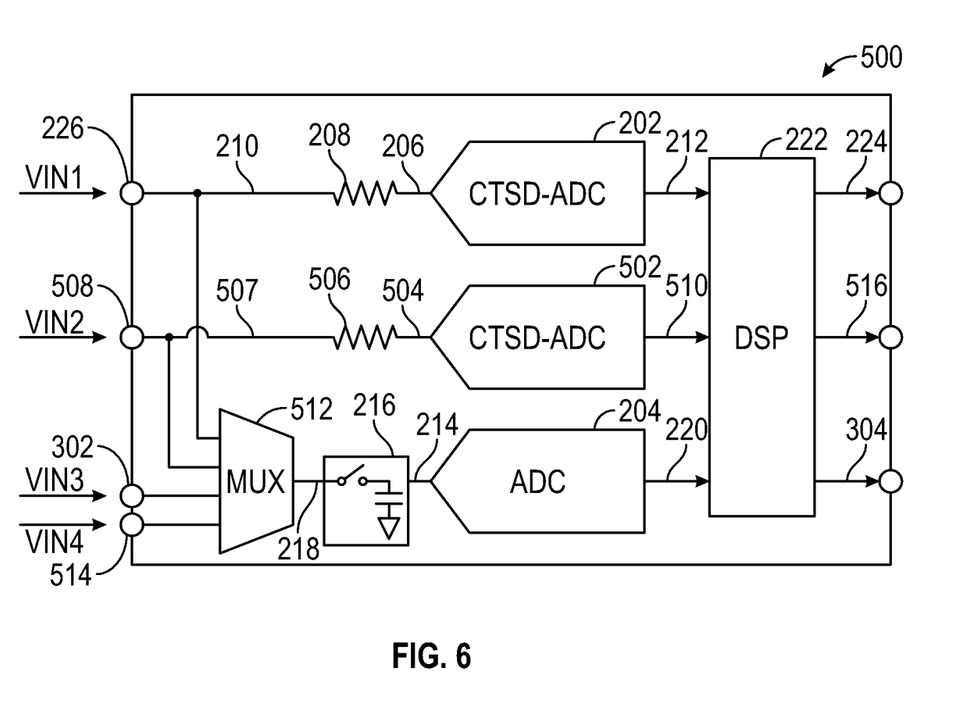
FIG. 6 is a block diagram of an example of a wide bandwidth ADC circuit including a multiplexer, in accordance with this disclosure.

FIG. 6 is a block diagram of another example of a wide bandwidth ADC circuit 500, in accordance with this disclosure. The ADC circuit 500 of FIG. 6 can combine multiple wide bandwidth and narrow bandwidth channels. The non-limiting example shown in FIG. 6 can include a first continuous-time sigma-delta ADC circuit 202 having an input 206 coupled to a resistive element 208 and configured to receive an analog input signal 210, a second continuous-time sigma-delta ADC circuit 502 having an input 504 coupled to a resistive element 506 and configured to receive an analog input signal 507, and an ADC circuit 204 having an input 214 coupled to a switched capacitor circuit 216 and configured to receive an analog input signal 218.

As mentioned above, in some examples, the ADC circuit 204 can include a continuous-time sigma-delta ADC circuit with a switched capacitive input. In other examples, the ADC circuit 204 can include a discrete-time ADC circuit. For example, the ADC circuit 204 can include a successive approximation register (SAR) ADC circuit, a flash ADC circuit, a sigma-delta ADC circuit, or a pipeline ADC circuit.

The input 206 of the first continuous-time sigma-delta ADC circuit 202 can be coupled to a first channel 226 and configured to generate a corresponding first digital output signal 212. The input 504 of the second continuous-time sigma-delta ADC circuit 502 can be coupled to a second channel 508 and configured to generate a corresponding second digital output signal 510.

The ADC circuit 500 of FIG. 6 can include a multiplexer 512. The multiplexer 512 can include inputs correspondingly coupled to the first channel 226, the second channel 508, a third channel 302, and, in some examples, a fourth channel 514. The first channel 226 can be configured to receive the analog signal VIN2, the second channel 508 can be configured to receive the analog signal VIN2, the third channel 302 can be configured to receive the analog signal VIN3, and the fourth channel 514 can be configured to receive the analog signal VIN4.

The multiplexer 512 can include an output coupled to an input 214 of the ADC circuit 204 and can be configured to select one of the first channel 226, the second channel 508, the third channel 302, and, in some examples, a fourth channel 514.

The digital signal processor 222 can be configured to receive a digital output signal 212 of the first continuous-time sigma-delta ADC circuit 202, a digital output signal 510 of the second continuous-time sigma-delta ADC circuit 502, and a digital output signal 220 of the ADC circuit 204. In the example shown in FIG. 6, the digital signal processor 222 can be configured to output parallel processed digital output signals 224, 516, 304 corresponding to the digital output signals 212, 510, 220. In other examples, the digital signal processor 222 can be configured to combine at least one of the digital output signal 212, the digital output signal 510, or the digital output signal 220 and output a single combined digital output signal.

The ADC circuit 500 of FIG. 6 can combine multiple wide bandwidth and narrow bandwidth channels. For example, for wideband AC measurements, the two parallel continuous-time sigma-delta ADC circuits 202, 502 can sample channels 226, 508 continuously, which can be AC measurement channels. The channels 302, 514 can be DC measurement channels. For narrowband DC measurements, the ADC circuit 204 does not need to simultaneously sample between channels, such as channels 302, 514, because narrowband signals can move slowly. As shown in FIG. 6, the multiplexer 512 can mux the input from multiple AC channels, such as channels 226, 508.

In FIGS. 3-6 above, it can be desirable in some instances to intentionally disable, either temporarily or permanently, a continuous-time sigma-delta ADC circuit or the second ADC circuit. For example, one of the continuous-time sigma-delta ADC circuit or the second ADC circuit can be intentionally disabled by software techniques, such as by a register program, or via hardware, such as by not connecting an input pin or by using a fuse to disable.

In a non-limiting example, it can be desirable to operate in an AC-only mode, such as for use with sonar, audio, or Coriolis flow meter applications, by disabling the second ADC circuit 204, such as in FIG. 4. In another non-limiting example, it can be desirable to operate in a DC-only mode, such as for measuring only measure DC signals, such as temperature and pressure, by disabling the continuous-time sigma-delta ADC circuit 202, such as in FIG. 4.

In FIGS. 3-6 above, it can be desirable for one ADC circuit to trigger another ADC circuit, such as to wake up it from a low power state. By way of a non-limiting example, ADC circuit can be used in a vibration application and the DC channel can be monitoring vibration. There can be significant information in the AC domain, but a customer can temporarily disable the AC channel by placing the continuous-time sigma-delta ADC circuit in a low-power state to save power. If a significant vibration occurs, the DC channel can detect the change in the signal amplitude over a wide bandwidth due to aliasing but it would be unable to differentiate amplitude changes by signal frequency, such as at 1 kHz or 10 kHz, etc. In such an example, the DC channel can be used to wake up the continuous-time sigma-delta ADC circuit in the AC channel, and the continuous-time sigma-delta ADC circuit can analyze the frequency information of the signal.

For example, the second ADC circuit 204 of FIG. 4 (coupled to the DC channel 302) can operate at much lower power than the continuous-time sigma-delta ADC circuit 202 of FIG. 4 (coupled to the AC channel 226). The continuous-time sigma-delta ADC circuit 202 can be in a low power state, such as a quiescent state, until the continuous-time sigma-delta ADC circuit 202 receives a wake-up signal from the digital signal processor 222. The digital signal processor 222 of FIG. 4 can use amplitude triggering and output a wake-up signal 306 to the continuous-time sigma-delta ADC circuit 202 when the amplitude exceeds a threshold value, for example, to put the continuous-time sigma-delta ADC circuit 202 in a fully powered ON state. In other words, the digital signal processor 222 of FIG. 4, for example, can compare an amplitude of one of the first processed digital output signal 212 and the second processed digital output signal 220 to a threshold, and generate and apply the wake-up signal to either the continuous-time sigma-delta ADC circuit (wake-up signal 306) or the second ADC circuit (wake-up signal 308) in response to the amplitude exceeding the threshold.

In another example, the continuous-time sigma-delta ADC circuit 202 of FIG. 4 (coupled to the AC channel 226) can be run continuously and the digital signal processor 222 of FIG. 4 can periodically output a signal 308 to the second ADC circuit 204 of FIG. 4 (coupled to the DC channel 302) to wake up from a low power state, such as a quiescent state, in order to correct for DC offset and/or drift. Although described with respect to FIG. 4, similar signals 306, 308 can be generated by the digital signal processors 222 of FIGS. 3, 5, and 6.

In FIG. 4, or in other configurations with separate inputs and outputs, it can be desirable in some examples to duty cycle between the two or more ADC circuits of the wide bandwidth analog-to-digital converter (ADC) circuit, which can allow the wide bandwidth analog-to-digital converter (ADC) circuit to toggle between the AC and DC channels. For example, the wide bandwidth analog-to-digital converter (ADC) circuit 300 of FIG. 4 can duty cycle between the continuous-time sigma-delta ADC circuit 202 (coupled to the AC channel 226) and the second ADC circuit 204 (coupled to the DC channel 302) using the signal 306, 308 from the digital signal processor 222. In a non-limiting example, the continuous-time sigma-delta ADC circuit 202 can perform continuous vibration monitoring and the second ADC circuit 204 can perform periodic temperature measurements. In another non-limiting example, the continuous-time sigma-delta ADC circuit 202 can perform periodic vibration monitoring and the second ADC circuit 204 can perform continuous temperature monitoring.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A wide bandwidth analog-to-digital converter (ADC) circuit comprising:
   a continuous-time sigma-delta first ADC circuit having a first input coupled to a resistive element to receive a first analog input signal and generate a first digital output signal;
   a second ADC circuit, independent of the continuous-time sigma-delta first ADC circuit, having a second input coupled to a switched capacitor circuit to receive a second analog input signal and an output to generate a second digital output signal that is independent of the first digital output signal; and
   a digital signal processor coupled to receive the first digital output signal and the second digital output signal and an output to generate at least one processed digital output signal.

2. The wide bandwidth ADC circuit of claim 1, comprising:
   a first channel to receive the first analog input signal,
   wherein the continuous-time sigma-delta first ADC circuit includes a first input, wherein the second ADC circuit includes a second input, and
   wherein the first input and the second input are coupled to the first channel.

3. The wide bandwidth ADC circuit of claim 2, the digital signal processor to combine the first digital output signal and the second digital output signal, and wherein the at least one processed digital output signal is a single combined digital output signal.

4. The wide bandwidth ADC circuit of claim 1, comprising:
a first channel to receive the first analog input signal; and
a second channel to receive the second analog input signal,
wherein the continuous-time sigma-delta first ADC circuit includes a first input coupled to the first channel, and
wherein the second ADC circuit includes a second input coupled to the second channel.

5. The wide bandwidth ADC circuit of claim 4, wherein the digital signal processor coupled to receive the first digital output signal and the second digital output signal and the output to generate at least one processed digital output signal is further coupled to:
receive the first digital output signal and generate a corresponding first processed digital output signal; and
receive the second digital output signal and generate a corresponding second processed digital output signal.

6. The wide bandwidth ADC circuit of claim 4, comprising:
an RC filter coupled to the second channel, the digital signal processor to combine the first digital output signal and the second digital output signal, and wherein the at least one processed digital output signal is a single combined digital output signal.

7. The wide bandwidth ADC circuit of claim 1, wherein the continuous-time sigma-delta first ADC circuit includes a first input coupled to a first channel, and wherein the second ADC circuit includes a second input coupled to a second channel, the wide bandwidth analog-to-digital converter (ADC) circuit further comprising:
a continuous-time sigma-delta third ADC circuit including a third input coupled to a third channel and that generates a third digital output signal, the digital signal processor to receive the third digital output signal;
the first channel to receive the first analog input signal;
the second channel to receive the second analog input signal;
the third channel to receive a third analog input signal; and
a multiplexer including inputs correspondingly coupled to the first channel, the second channel, and the third channel, the multiplexer including an output coupled to an input of the second ADC circuit, the multiplexer to select one of the first channel, the second channel, and the third channel.

8. The wide bandwidth ADC circuit of claim 7, wherein the digital signal processor coupled to receive the first digital output signal and the second digital output signal and the output to generate at least one processed digital output signal is further coupled to:
receive the first digital output signal and generate a corresponding first processed digital output signal;
receive the second digital output signal and generate a corresponding second processed digital output signal; and
receive the third digital output signal and generate a corresponding third processed digital output signal.

9. The wide bandwidth ADC circuit of claim 1, wherein the second ADC circuit includes a switched capacitor input.

10. The wide bandwidth ADC circuit of claim 1, wherein the second ADC circuit includes a successive approximation register (SAR) ADC.

11. The wide bandwidth ADC circuit of claim 1, wherein either the continuous-time sigma-delta first ADC circuit or the second ADC circuit is configured to be intentionally disabled.

12. The wide bandwidth ADC circuit of claim 1, the digital signal processor to generate and apply a wake-up signal to either the continuous-time sigma-delta first ADC circuit or the second ADC circuit.

13. A method of operating a wide bandwidth ADC circuit, the method comprising:
receiving, using a continuous-time sigma-delta first ADC circuit, a first analog input signal and generating a first digital output signal;
receiving, using a second ADC circuit that is independent of the continuous-time sigma-delta first ADC circuit, a second analog input signal and generating a second digital output signal that is independent of the first digital output signal; and
processing the first digital output signal and the second digital output signal and generating at least one processed digital output signal.

14. The method of claim 13, wherein processing the first digital output signal and the second digital output signal and generating the at least one processed digital output signal includes:
generating a first processed digital output signal and a second processed digital output signal corresponding to the first digital output signal and the second digital output signal, respectively.

15. The method of claim 13, comprising:
filtering, using an RC filter coupled to the second ADC circuit, an input signal applied to the wide bandwidth ADC circuit.

16. The method of claim 13, comprising:
generating and applying a wake-up signal to either the continuous-time sigma-delta first ADC circuit or the second ADC circuit.

17. The method of claim 16, comprising:
comparing an amplitude of one of the first processed digital output signal and a second processed digital output signal to a threshold; and
generating and applying the wake-up signal to either the continuous-time sigma-delta first ADC circuit or the second ADC circuit in response to the amplitude exceeding the threshold.

18. A wide bandwidth analog-to-digital converter (ADC) circuit comprising:
a first continuous-time sigma-delta ADC circuit having a first input coupled to a resistive element to receive a first analog input signal and generate a first digital output signal;
a second continuous-time sigma-delta ADC circuit, independent of the first continuous-time sigma-delta ADC circuit, having a second input coupled to a switched capacitor circuit to receive a second analog input signal and an output to generate a second digital output signal that is independent of the first digital output signal; and
a digital signal processor coupled to receive the first digital output signal and the second digital output signal and an output to generate at least one processed digital output signal.

19. The wide bandwidth ADC circuit of claim 18, comprising:
a first channel to receive the first analog input signal,
wherein the first continuous-time sigma-delta ADC circuit includes a first input,
wherein the second continuous-time sigma-delta ADC circuit includes a second input, and
wherein the first input and the second input are coupled to the first channel.

20. The wide bandwidth ADC circuit of claim 18, comprising:
 a first channel to receive the first analog input signal; and
 a second channel to receive the second analog input signal,
 wherein the first continuous-time sigma-delta ADC circuit includes a first input coupled to the first channel, and
 wherein the second continuous-time sigma-delta ADC circuit includes a second input coupled to the second channel.

* * * * *